(12) United States Patent
Khlat

(10) Patent No.: US 12,456,965 B2
(45) Date of Patent: Oct. 28, 2025

(54) ACOUSTIC FILTERS PROVIDING NEGATIVE CAPACITANCE FOR USE IN MULTIPLEXERS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 249 days.

(21) Appl. No.: 18/251,249

(22) PCT Filed: Sep. 23, 2021

(86) PCT No.: PCT/US2021/051675
§ 371 (c)(1),
(2) Date: May 1, 2023

(87) PCT Pub. No.: WO2022/103492
PCT Pub. Date: May 19, 2022

(65) Prior Publication Data
US 2023/0412149 A1    Dec. 21, 2023

Related U.S. Application Data

(60) Provisional application No. 63/112,817, filed on Nov. 12, 2020.

(51) Int. Cl.
*H03H 9/70*     (2006.01)
*H03H 9/205*    (2006.01)
(Continued)

(52) U.S. Cl.
CPC ............ *H03H 9/706* (2013.01); *H03H 9/205* (2013.01); *H03H 9/542* (2013.01); *H03H 9/605* (2013.01)

(58) Field of Classification Search
CPC ........ H03H 9/605; H03H 9/542; H03H 9/205; H03H 9/706
(Continued)

(56) References Cited

U.S. PATENT DOCUMENTS

2005/0030126 A1    2/2005  Inoue et al.
2008/0007369 A1*   1/2008  Barber .................. H03H 9/605
                                                            333/189
(Continued)

FOREIGN PATENT DOCUMENTS

EP        2590326 A2     5/2013
WO     2008009274 A1    1/2008

OTHER PUBLICATIONS

International Search Report and Written Opinion for International Patent Application No. PCT/US2021/051675, mailed Jan. 11, 2022, 18 pages.

*Primary Examiner* — Rakesh B Patel
(74) *Attorney, Agent, or Firm* — Withrow & Terranova, P.L.L.C.

(57) ABSTRACT

An acoustic filter providing negative capacitance for use in multiplexers is provided that may include a first resonator and a second resonator. The second resonator may be a three terminal element that includes two sub-resonator elements having opposite polarities that are mechanically coupled such that as one sub-resonator expands, the other contracts. The second resonator may act as a negative capacitance element relative to the first resonator such that the second resonator provides cancelation at specific frequencies. This structure may further reduce the order of an N-multiplexer ladder network and reduce total insertion loss.

12 Claims, 12 Drawing Sheets

(51) Int. Cl.
  *H03H 9/54* (2006.01)
  *H03H 9/60* (2006.01)
(58) Field of Classification Search
  USPC .................................. 333/126, 129, 186, 193
  See application file for complete search history.

(56) References Cited

U.S. PATENT DOCUMENTS

| | | |
|---|---|---|
| 2017/0099652 A1* | 4/2017 | Mandegaran .......... H04B 1/005 |
| 2020/0028490 A1 | 1/2020 | Kato |
| 2020/0099360 A1 | 3/2020 | Khlat |
| 2020/0099363 A1 | 3/2020 | Khlat |
| 2020/0259482 A1 | 8/2020 | Khlat |

* cited by examiner

POSITIVE VOLTAGE COMPRESS

NEGATIVE VOLTAGE EXPAND

POSITIVE VOLTAGE EXPAND

NEGATIVE VOLTAGE COMPRESS

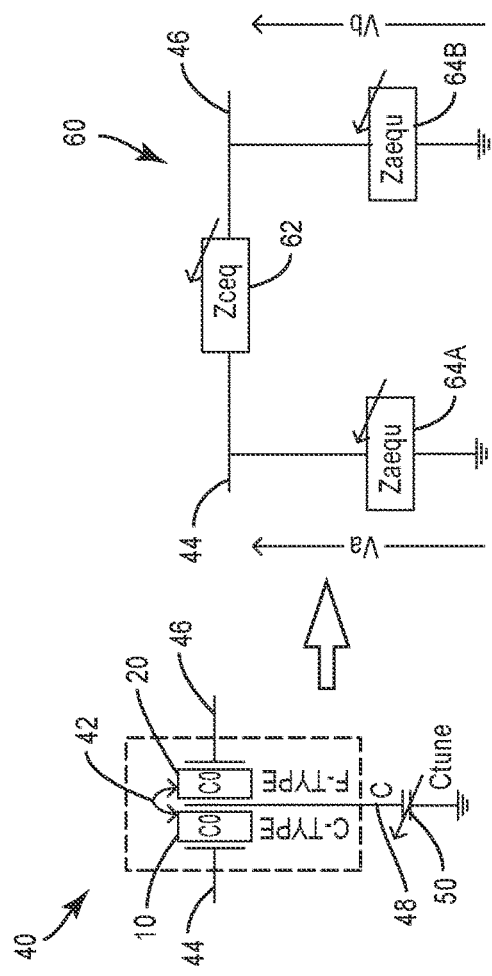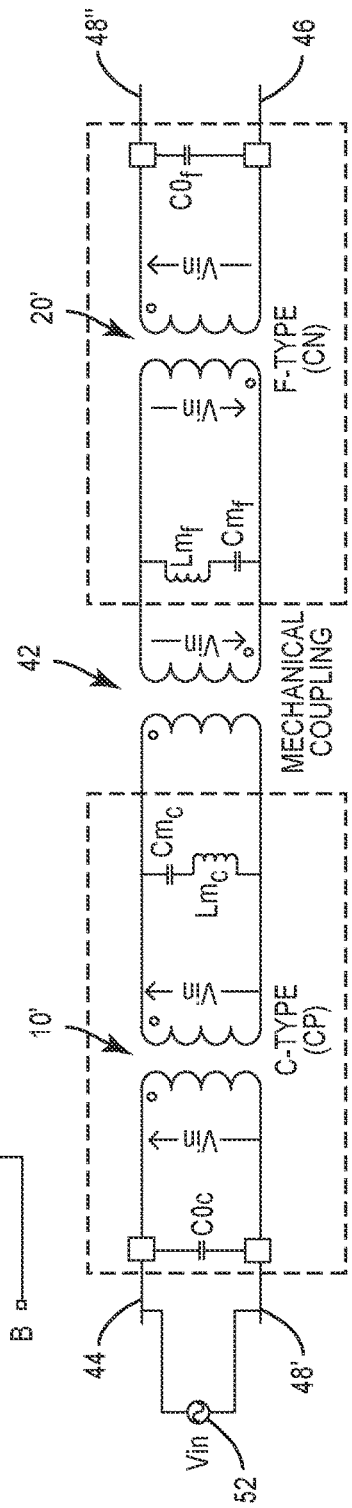
FIG. 4
FIG. 5

ACOUSTIC FILTERS PROVIDING NEGATIVE CAPACITANCE FOR USE IN MULTIPLEXERS

RELATED APPLICATIONS

This application is a 35 USC 371 national phase filing of International Application No. PCT/US2021/051675, filed Sep. 23, 2021, which claims the benefit of U.S. provisional patent application Ser. No. 63/112,817, filed Nov. 12, 2020, the disclosures of which are incorporated herein by reference in their entireties.

FIELD OF THE DISCLOSURE

The technology of the disclosure relates generally to an acoustic filter that may be incorporated into a multiplexer to perform cancelation within the multiplexer.

BACKGROUND

Computing devices have become increasingly common for myriad purposes including providing wireless communication services. The prevalence of these computing devices is driven in part by the many functions that are enabled on such devices. In addition to the many functions, the size and cost of computing devices are at a point where almost anyone can afford at least a rudimentary computing device.

A common element in most computing devices is a multiplexer. A multiplexer is a device that selects between several input signals and forwards the selected input signal to a single output line. A common challenge for a multiplexer is filtering out non-selected signals while not attenuating the selected signal. As signal frequencies increase within computing devices, additional challenges to multiplexer design are presented. Accordingly, improved multiplexer design at an appropriate size and for a commercially practical cost provides room for innovation.

SUMMARY

Embodiments of the disclosure relate to acoustic filters providing negative capacitance for use in multiplexers. In particular, an acoustic resonator is provided that may include a first resonator and a second resonator. The second resonator may be a three-terminal element that includes two sub-resonator elements having opposite polarities that are mechanically coupled such that, as one sub-resonator expands, the other contracts or compresses. The second resonator may act as a negative capacitance element relative to the first resonator such that the second resonator provides cancelation at specific frequencies. This structure may further reduce the order of an N-multiplexer ladder network and reduce total insertion loss.

In one aspect, an acoustic resonator is provided. The acoustic resonator comprises a first resonator element. The first resonator element comprises a first terminal and a second terminal. The acoustic resonator also comprises a second resonator element. The second resonator element comprises a first sub-resonator element having a first polarity. The first sub-resonator element is coupled to the first terminal. The second resonator element also comprises a second sub-resonator element having a second polarity opposite the first polarity. The second sub-resonator element is mechanically coupled to the first sub-resonator with a third terminal therebetween and the second sub-resonator is coupled to the second terminal.

In another aspect, a multiplexer is provided. The multiplexer comprises an input. The multiplexer also comprises a first acoustic filter. The first acoustic filter comprises a first resonator element. The first resonator element comprises a first terminal coupled to the input. The first resonator element also comprises a second terminal. The first acoustic filter also comprises a second resonator element. The second resonator element comprises a first sub-resonator element having a first polarity. The first sub-resonator element is coupled to the first terminal. The second resonator element also comprises a second sub-resonator element having a second polarity opposite the first polarity. The second sub-resonator element is mechanically coupled to the first sub-resonator with a third terminal therebetween. The multiplexer also comprises a second acoustic filter. The second acoustic filter comprises a third resonator element. The third resonator element comprises a fourth terminal coupled to the input. The third resonator element also comprises a fifth terminal. The second acoustic filter also comprises a fourth resonator element. The fourth resonator element comprises a third sub-resonator element having the first polarity. The third sub-resonator element is coupled to the fourth terminal. The fourth resonator element also comprises a fourth sub-resonator element having the second polarity. The fourth sub-resonator element is mechanically coupled to the third sub-resonator with a sixth terminal therebetween. The fourth sub-resonator element is coupled to the second terminal and the second sub-resonator element is coupled to the fifth terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 illustrates a circuit equivalence between a three-terminal resonator element having a tunable capacitor at a third terminal;

FIG. 5 is an electrical model of two mechanically-coupled resonator sub-resonators with three terminals;

DETAILED DESCRIPTION

Figure 1:
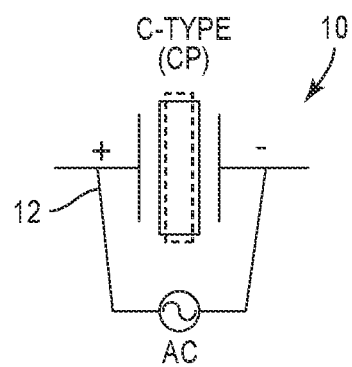
FIG. 1 is a schematic diagram of f-type and c-type acoustic materials that expand and compress based on an applied voltage, where these acoustic materials form building blocks for aspects of the present disclosure.
Figure 1:
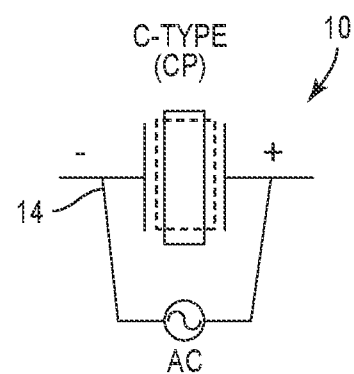
Figure 1:
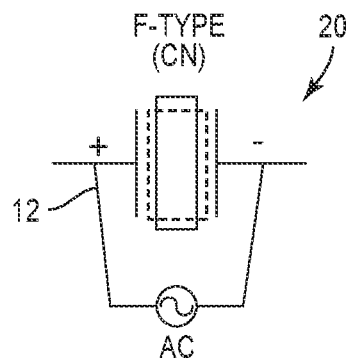
Figure 1:
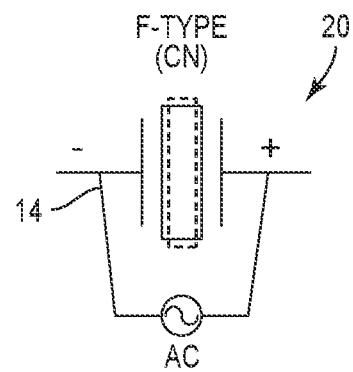

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to acoustic filters providing negative capacitance for use in multiplexers. In particular, an acoustic resonator is provided that may include a first resonator and a second resonator. The second resonator may be a three-terminal element that includes two sub-resonator elements having opposite polarities that are mechanically coupled such that, as one sub-resonator expands, the other compresses or contracts. The second resonator may act as a negative capacitance element relative to the first resonator such that the second resonator provides cancelation at specific frequencies. This structure may further reduce the order of an N-multiplexer ladder network and reduce total insertion loss.

Before addressing exemplary aspects of the present disclosure, a background on acoustic resonators is provided along with a discussion of a resonator formed from two mechanically coupled, opposite polarity resonators. With this background a discussion of exemplary aspects of the present disclosure begins below with reference to FIG. 8.

Initially note that a resonator may be based on an aluminum nitride (AlN) material although other materials may also be used. A resonator may be a positive polarity acoustic material that, when a positive radio frequency (RF) voltage is placed across the terminals of a thin piezoelectric, results in a compression in the acoustic thickness of the piezo-material. This material is generally called a c-type piezoelectric material. Likewise, applying a negative voltage to the material results in an expansion of the thickness of the piezo-material. An inverted polarity piezoelectric does the opposite where positive voltage results in expansion and negative voltage results in compression. This material is generally called an f-type piezoelectric material. Note that AlN can be both an f-type and a c-type material.

FIG. 1 illustrates a positive polarity acoustic element (c-type) 10 that compresses when a positive voltage 12 is applied and expands when a negative voltage 14 is applied. Similarly, FIG. 1 also illustrates an inverted polarity acoustic element (f-type) 20 that expands when the positive voltage 12 is applied and compresses when the negative voltage 14 is applied.

Figure 2:
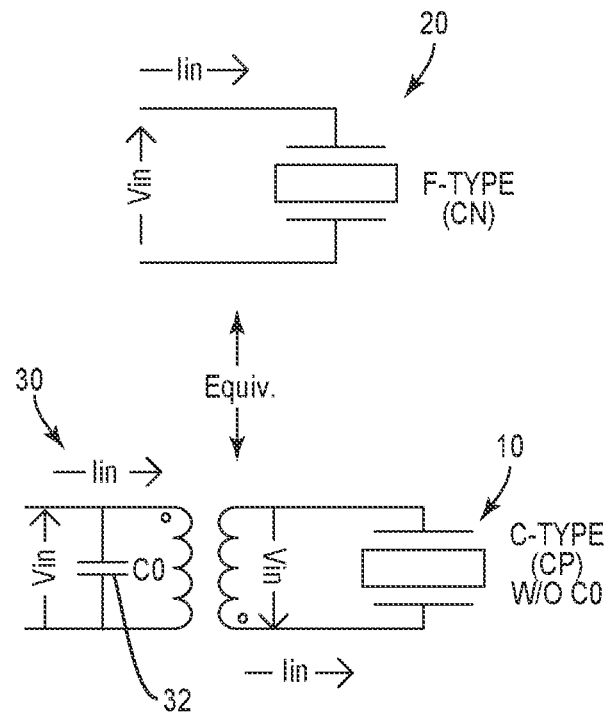
FIG. 2 illustrates an equivalent circuit for an f-type acoustic material.

An inverted polarity AlN material is basically equivalent electrically to the positive polarity acoustic element 10 with a voltage inversion transformer 30 applied as illustrated in FIG. 2. The transformer 30 may include a capacitor 32. This equivalence may be used to model resonators as explained in greater detail below.

Figure 3:
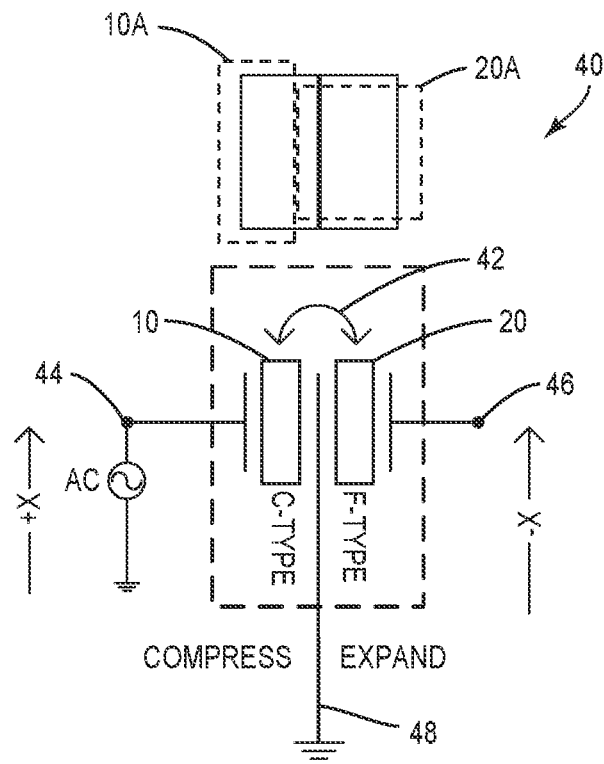
FIG. 3 illustrates a resonator element having two sub-resonator elements of opposite polarity that are mechanically coupled.

It is possible to couple a positive polarity acoustic element 10 with an inverted polarity acoustic element 20 to create a three-terminal device 40 as better seen in FIG. 3. Specifically, mechanical coupling 42 couples the positive polarity acoustic element 10 to the inverted polarity acoustic element 20 between a first terminal 44 and a second terminal 46. A third terminal 48 may be provided from the juncture of the two elements 10, 20. As element 10 compresses (10A), element 20 expands (20A) and vice versa. As illustrated, the third terminal 48 may be tied to a ground. However, as illustrated in FIG. 4, the third terminal 48 may be coupled to a variable capacitor 50. The variable capacitor 50 allows the modification of the parallel resonance frequency between terminal 44 and terminal 46. That is, the presence of the variable capacitor 50 creates an equivalent negative capacitor between the terminals 44 and 46. With the variable capacitor 50 in place, an equivalent electrical network 60 may be modeled with variable impedance 62 between the terminals 44 and 46 and variable impedances 64A, 64B between the terminal 44 and ground and the terminal 46 and ground, respectively.

The intrinsic electromechanical coupling factor of a resonator that has a series resonance frequency fr=fs and a parallel resonance frequency fa=fp may be expressed as follows:

$$k_t^2 = \frac{\pi}{2}\frac{f_r}{f_a}\left[\tan\left(\frac{\pi}{2}\frac{f_r}{f_a}\right)\right]^{-1}$$

This relationship further allows the three-terminal device 40 to be modeled as multiple transformers as illustrated in FIG. 5. The third terminal 48 of the three-terminal device 40 may conceptualized as two sub-terminals 48' and 48". When modeled with transformers, the first positive polarity acoustic element becomes a transformer element 10' and the second positive polarity acoustic element 20 becomes a transformer element 20'. A voltage source 52 may be applied between terminals 44 and 48' causing the transformer element 10' to drive the transformer element 20' through the mechanical coupling 42. The second transformer element 20' provides an output between terminals 46 and 48".

Figure 6:
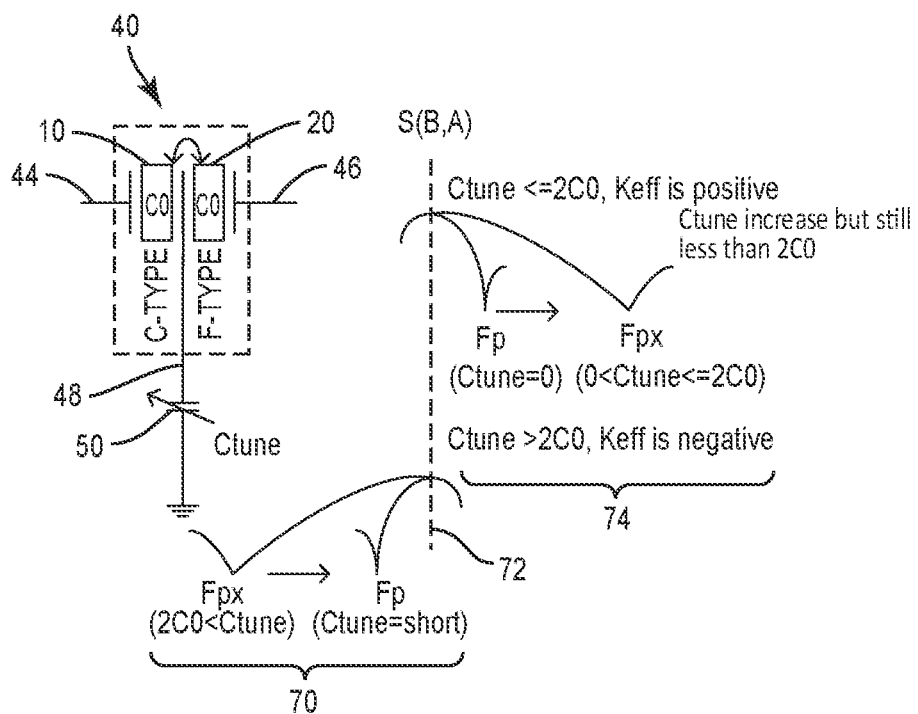
FIG. 6 illustrates an effective coupling factor for a resonator having two mechanically-coupled sub resonators and a change that occurs when tuning a capacitor on the third terminal.

Using the original three-terminal device 40, or the transformer model of FIG. 5, an interesting phenomenon may be observed. When the value (Ctune) of the variable capacitor 50 is set to zero (0), the parallel resonance between the terminals 44 and 46 (due to Zcequ) has a frequency Fp set by the intrinsic coupling factor of the acoustic resonator set by C0. When the value of Ctune is increased, the parallel resonance frequency is increased relative to the series resonance (which remains unchanged) resulting in an effective coupling factor Keff increasing until Ctune becomes equal to 2C0. When Ctune exceeds 2C0, the parallel resonance becomes lower than the series resonance and an inversion of sign occurs for Keff. This inversion is illustrated stylistically in FIG. 6, where it can be seen that the variable capacitor 50 may be tuned between zero and 2C0 (generally at 70) where inversion 72 occurs and Ctune may be further tuned (generally at 74).

Figure 7:
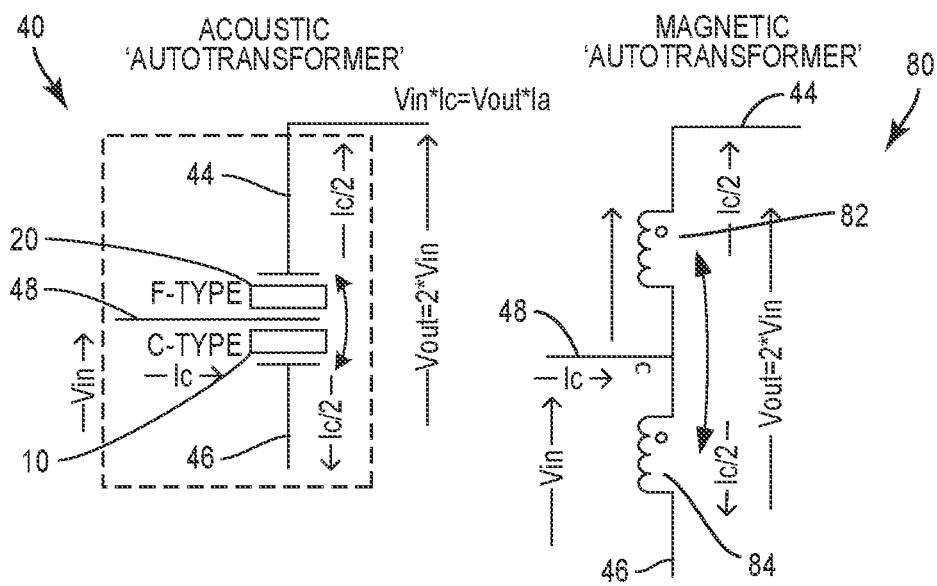
FIG. 7 illustrates an equivalence between an acoustic resonator and an autotransformer.

By way of further explanation, the three-terminal device 40 may also be equivalent to an autotransformer 80 at a specific frequency range as shown in FIG. 7, where the autotransformer 80 is formed by two negatively-coupled inductors 82, 84.

The ramification of the various equivalent circuits and the behavior of the acoustic elements 10, 20 as the variable capacitor 50 is tuned provide some interesting opportunities. In particular, the behavior allows a negative capacitor cancelation approach to creating a filter. For example, a filter may be formed by providing a first acoustic element of a given polarity type in parallel to an acoustic element (e.g., three-terminal device 40) where the series frequency of the three-terminal device is at a frequency f0 different than that of the acoustic element on which cancelation is desired.

Figure 8:
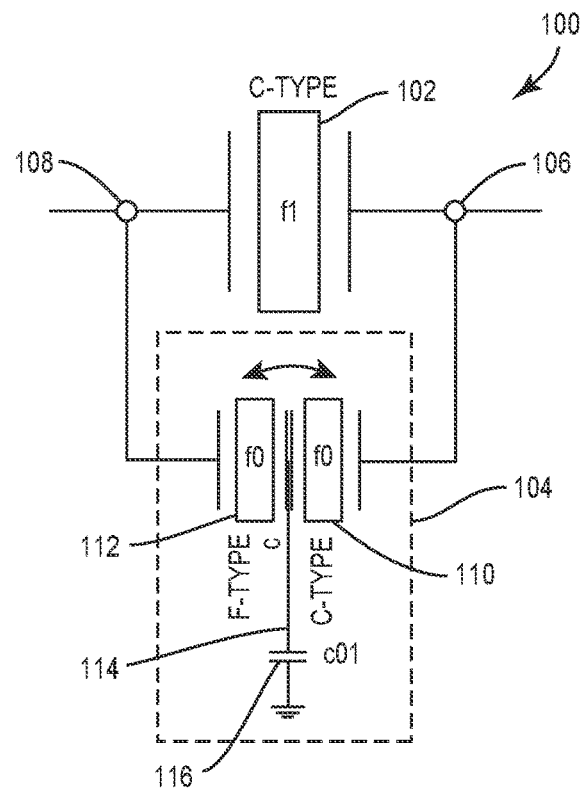
FIG. 8 illustrates a two-resonator topology where one resonator operates as a negative capacitor.

In this regard, FIG. 8 illustrates a filter 100 formed of a first resonator element 102 and a second resonator element 104. The first resonator element 102 has a first terminal 106 and a second terminal 108. The first resonator element 102 may be an acoustic element that has a first polarity (e.g., it may be a c-type resonator) and have a primary frequency of f1. The second resonator element 104 includes a first sub-resonator element 110 having the first polarity (e.g., c-type) and a second sub-resonator element 112 having a second polarity opposite the first polarity (e.g., f-type). The second sub-resonator element 112 is mechanically coupled to the first sub-resonator element 110. Both sub-resonator elements 110, 112 may have a resonant frequency of f0. A third terminal 114 is positioned between the first sub-resonator element 110 and the second sub-resonator element 112. The first sub-resonator element 110 is coupled to the first terminal 106, and the second sub-resonator element 112 is coupled to the second terminal 108. A capacitor 116 (also referred to as C01 in FIG. 8) may be coupled to the third terminal 114 and a fixed voltage (e.g., ground).

Figure 9:
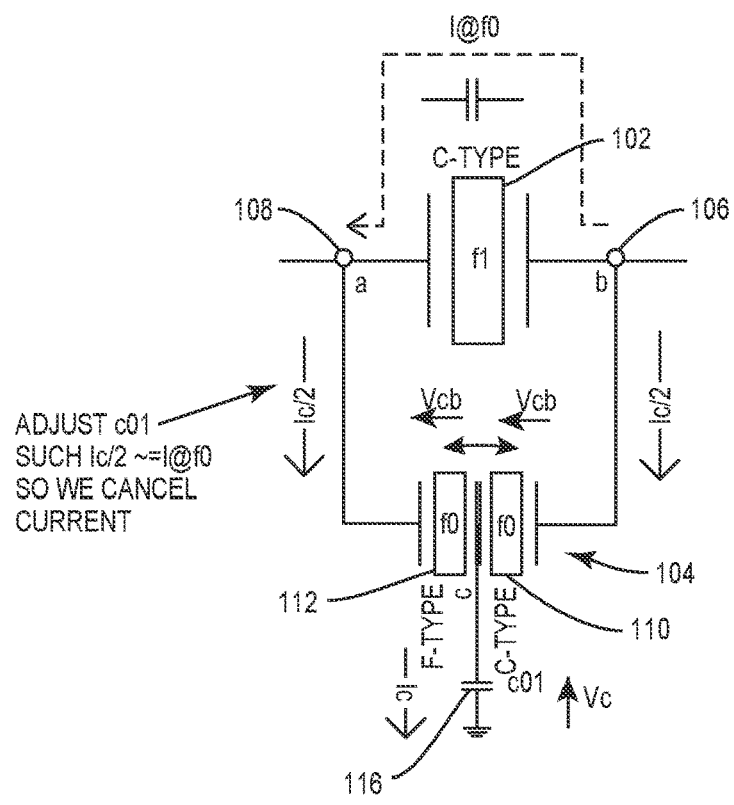
FIG. 9 illustrates how the two-resonator topology of FIG. 8 provides cancelation at a designated frequency.

The first resonator element 102 may have, as noted, a resonating frequency f1. The first resonator element 102 can behave at out-of-band frequencies like a capacitor, and thus, the second resonator element 104 (with its two sub-resonator elements 110, 112) will create an equivalent negative capacitance creating an opposite current such that the total current flowing out of the second terminal 108 or into the first terminal 106 will be reduced at the out-of-band frequencies and specifically reduced at the f0 frequency. The current flow is better illustrated in FIG. 9 where the current I at f0 flowing between the first terminal 106 and the second terminal 108 through the first resonator element 102 is canceled by the current Ic flowing through the second resonator element 104. It should be appreciated that the value of the capacitor 116 may be selected or tuned such that Ic=I at f0.

From the structure of the filter 100 and its associated cancelation technique, an N-multiplexer using acoustic filters may be formed. A variety of exemplary multiplexers are illustrated in FIGS. 10-15. It should be appreciated that any multiplexer has a common port (e.g., the input port) and multiple output ports.

Figure 10:
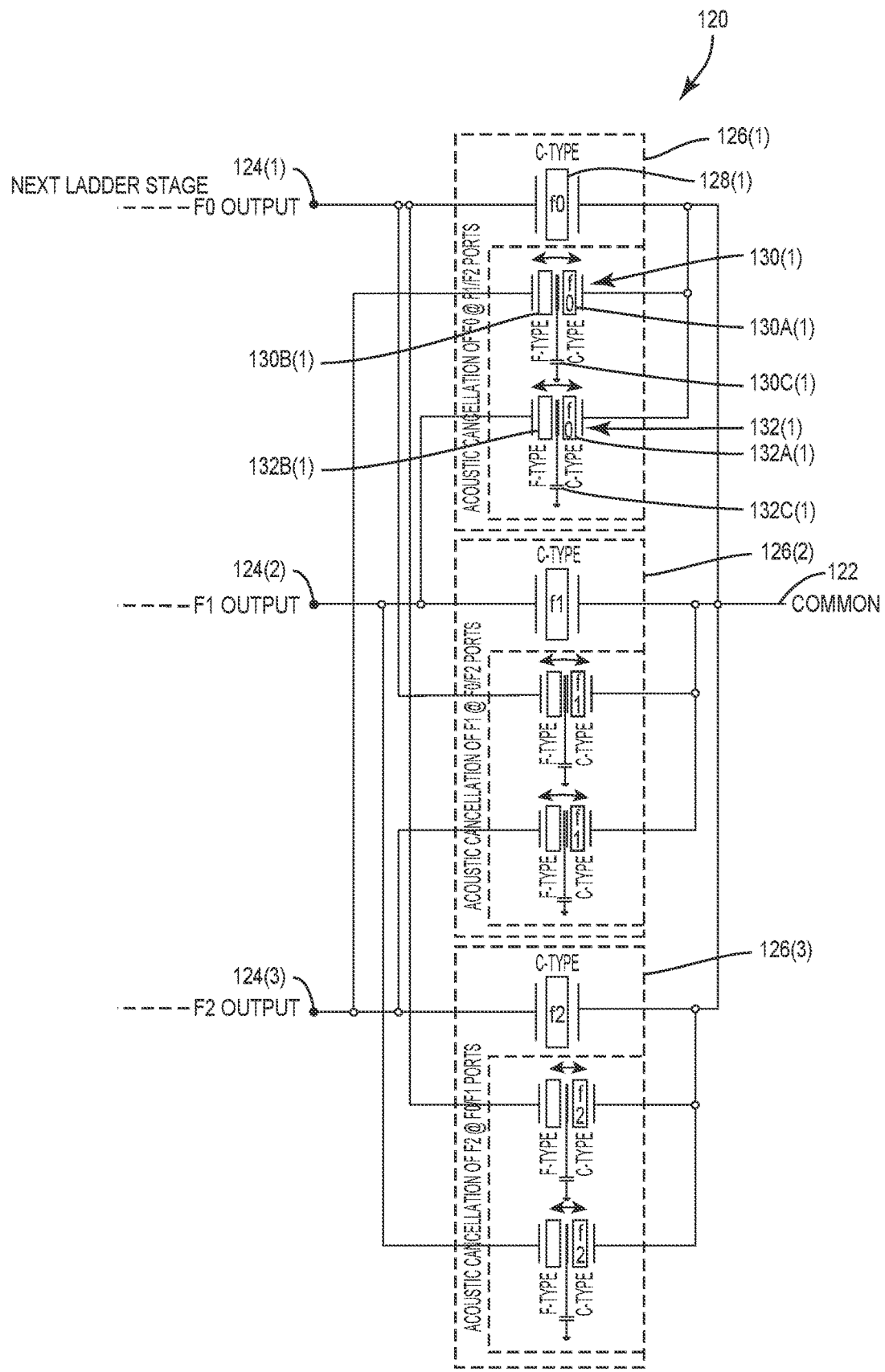
FIG. 10 illustrates an N-multiplexer with cancelation using the two-resonator topology of FIG. 8.

FIG. 10 provides a first exemplary multiplexer 120 using acoustic filters with associated negative capacitance. As illustrated, the multiplexer 120 includes a single input terminal 122 and three output terminals 124(1)-124(3) although as few as two and as many as N output terminals 124 could be present. A plurality of acoustic filters 126(1)-126(3) are coupled to the input terminal 122 and the respective output terminal 124(1)-124(3).

With continued reference to FIG. 10, the acoustic filter 126(1) includes a first resonator element 128(1), a second resonator element 130(1), and a third resonator element 132(1). The first resonator element 128(1) has a first polarity (e.g., c-type) with a resonant frequency f0. The second resonator element 130(1) and the third resonator element 132(1) may also have a resonant frequency f0.

The second resonator element 130(1) has a first sub-resonator element 130A(1), a second sub-resonator element 130B(1), and a tuning capacitor 130C(1). The first sub-resonator element 130A(1) may also have the first polarity, while the second sub-resonator element 130B(1) may have the opposite polarity (e.g., f-type). The first sub-resonator element 130A(1) is mechanically coupled to the second sub-resonator element 130B(1). The second resonator element 130(1) is coupled to the third output 124(3) to provide cancelation at frequency f0 to the third acoustic filter 126(3).

The third resonator element 132(1) has a first sub-resonator element 132A(1), a second sub-resonator element 132B(1), and a tuning capacitor 132C(1). The first sub-resonator element 132A(1) may also have the first polarity, while the second sub-resonator element 132B(1) may have the opposite polarity (e.g., f-type). The first sub-resonator element 132A(1) is mechanically coupled to the second sub-resonator element 132B(1). The third resonator element 132(1) is coupled to the second output 124(2) to provide cancelation at frequency f0 to the second acoustic filter 126(2).

The second acoustic filter 126(2) is similar to the first acoustic filter 126(1), but operates with a resonant frequency of f1 and is coupled to the first and third acoustic filters 126(1) and 126(3) to provide cancelation at frequency f1. Similarly, the third acoustic filter 126(3) operates with a resonant frequency of f2 and is coupled to the first and second acoustic filters 126(1) and 126(2) to provide cancelation at frequency f2. It should be appreciated that this may be scaled upwards to N acoustic filters if needed or desired.

Figure 11:
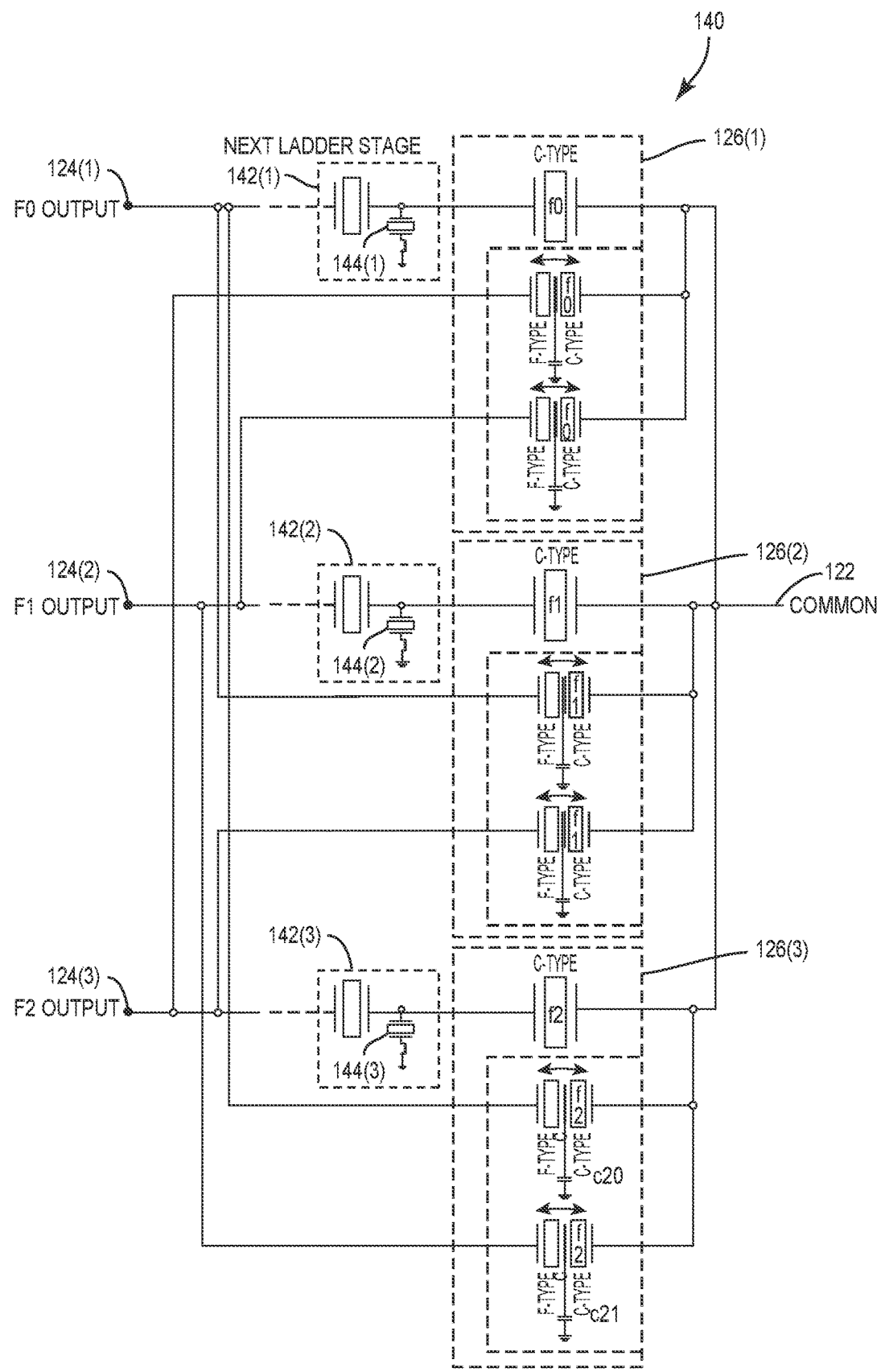
FIG. 11 illustrates an alternate N-multiplexer with cancelation performed outside of each ladder.

FIG. 11 provides an alternate structure for a multiplexer 140 that provides additional cancelation at outputs 124(1)-124(3). Specifically, at each output 124(1)-124(3), a series resonator element 142(1)-142(3) and a grounded resonator element 144(1)-144(3) are added. While perhaps greater cancelation may be achieved, the structure of the multiplexer 140 is more difficult to manufacture, takes more space, and is more expensive. However, for certain applications, the increased cancelation may merit accepting these tradeoffs.

Figure 12:
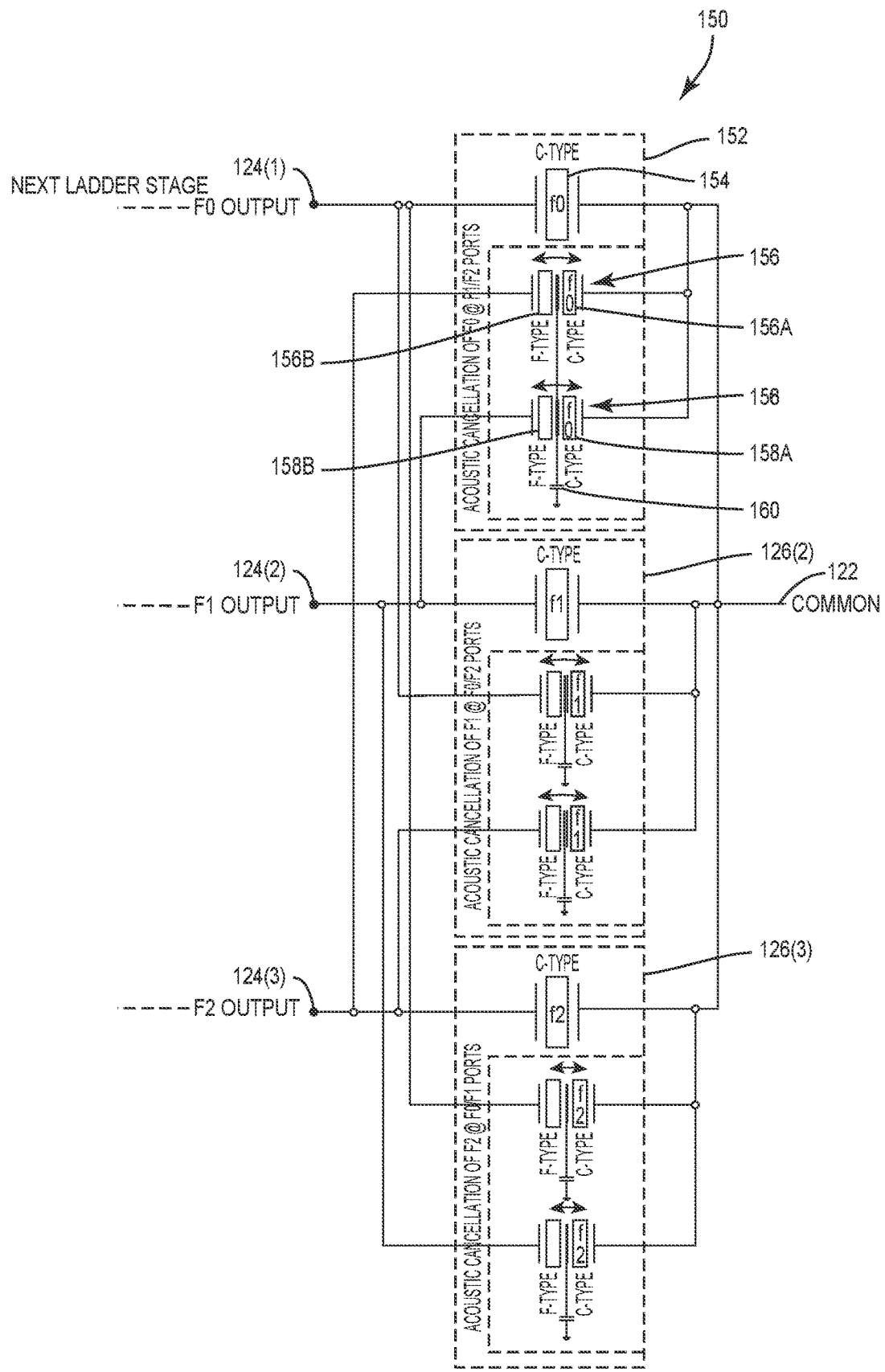
FIG. 12 illustrates an alternate N-multiplexer with shared shunt capacitors.

FIG. 12 illustrates an alternate structure for a multiplexer 150 that merges the capacitors to tune the cancelation. Specifically, the multiplexer 150 includes a first acoustic filter 152, a second acoustic filter 126(2), and a third acoustic filter 126(3). The first acoustic filter 152 includes a first resonator element 154, a second resonator element 156, and a third resonator element 158 all having a resonant frequency of f0. The second resonator element 156 has a first sub-resonator element 156A and a second sub-resonator element 156B. The first sub-resonator element 156A may also have the first polarity, while the second sub-resonator element 156B may have the opposite polarity (e.g., f-type). The first sub-resonator element 156A is mechanically coupled to the second sub-resonator element 156B.

Similarly, the third resonator element 158 has a first sub-resonator element 158A and a second sub-resonator element 158B. The first sub-resonator element 158A may also have the first polarity, while the second sub-resonator element 158B may have the opposite polarity (e.g., f-type). The first sub-resonator element 158A is mechanically coupled to the second sub-resonator element 158B.

The second and third resonator elements 156, 158 share a tuning capacitor 160. When an appropriate value of the tuning capacitor 160 is chosen, it may still tune both the second and third resonator elements 156, 158 as desired. Note that while only the first acoustic filter 152 is shown with a shared tuning capacitor 160, the other acoustic filters 126(2) and 126(3) may be modified to also include a shared tuning capacitor.

Figure 13:
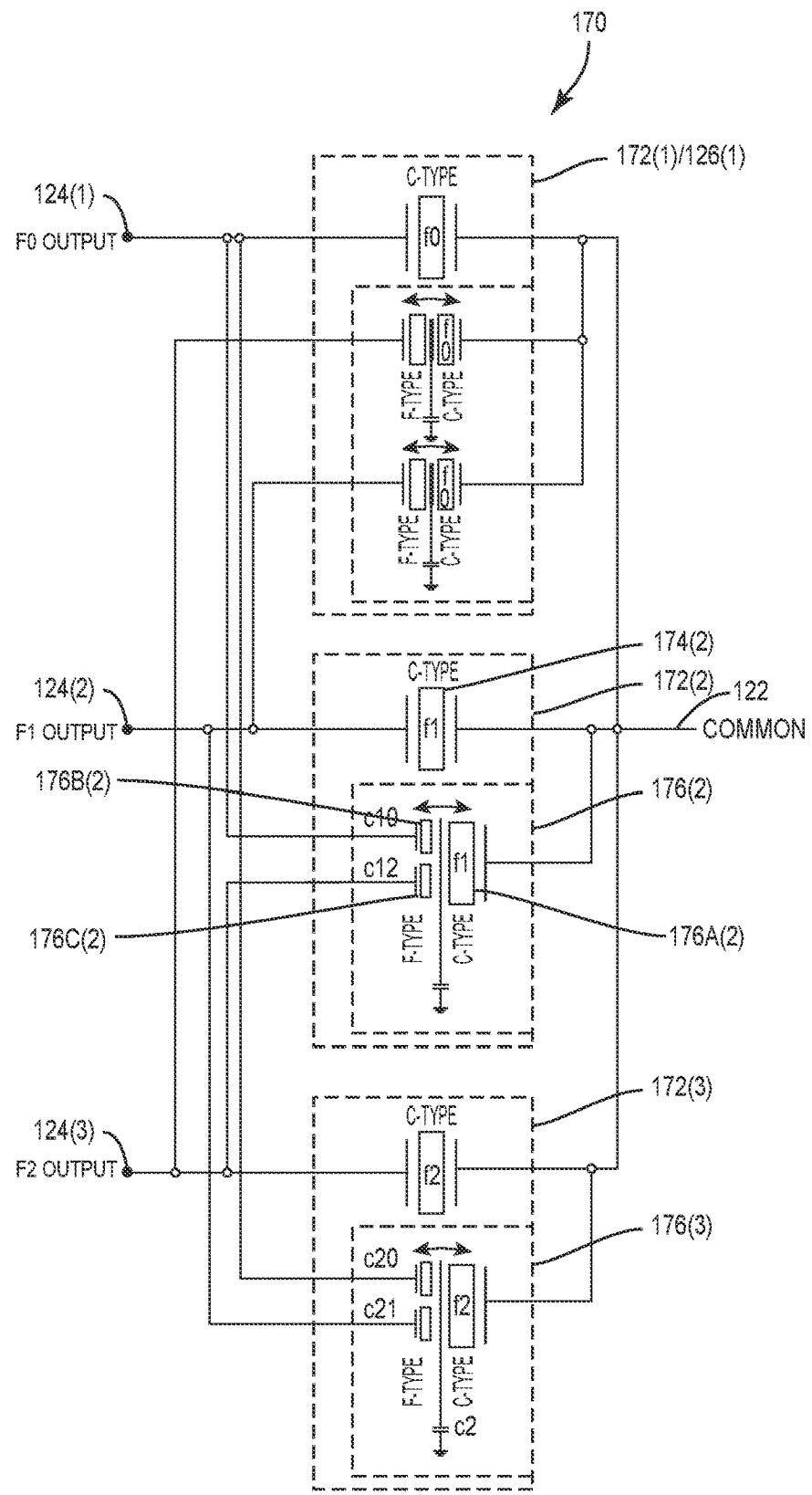
FIG. 13 illustrates an alternate N-multiplexer using paired sub-resonators to create multiple cancelation outputs.

FIG. 13 provides another alternate structure in multiplexer 170, where instead of having separate second and third resonator elements, these elements are merged. Specifically, the multiplexer 170 includes acoustic filters 172(1)-172(3). The second acoustic filter 172(2) includes a first resonator element 174(2) having a first polarity and operating at a resonant frequency f1. The second acoustic filter 172(2) further includes a second resonator element 176(2). The second resonator element 176(2) includes a first sub-resonator element 176A(2) that has the first polarity and operates at the resonant frequency f1. The second resonator element 176(2) further includes a second sub-resonator element 176B(2) and a third sub-resonator element 176C(2). The second and third sub-resonator elements 176B(2) and 176C(2) have an opposite polarity (e.g., both may be f-type) and provide different negative capacitances. The second sub-resonator element 176B(2) is coupled to the first output 124(1) while the third sub-resonator element 176C(2) is coupled to the third output 124(3). The third acoustic filter 172(3) has a similar second resonator element 176(3). Conversely, the first acoustic filter 172(1) has a structure identical to the first acoustic filter 126(1) of FIG. 10. The capacitance and thus frequency of cancelation of the second and third sub resonator elements 176B(2) and 176C(2) may be varied by changing the size of the elements.

Figure 14:
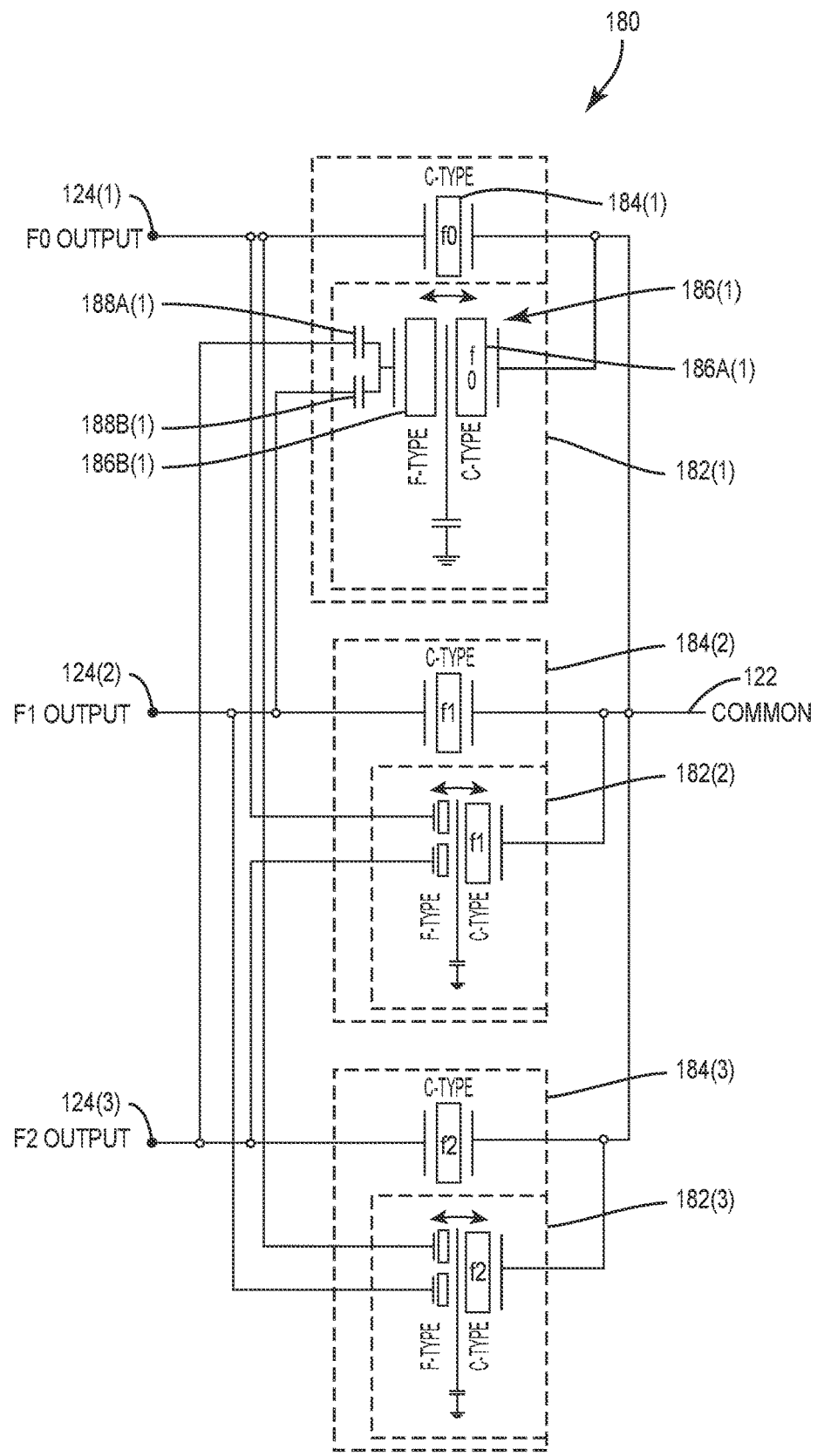
FIG. 14 illustrates an alternate N-multiplexer with two output capacitors for alternate cancelation options.

FIG. 14 illustrates another alternate structure for a multiplexer 180 that consolidates the sub-resonator elements and instead uses parallel capacitances to change the cancelation frequency. Specifically, the multiplexer 180 includes acoustic filters 182(1)-182(3). The first acoustic filter 182(1) includes a first resonator element 184(1) and a second resonator element 186(1) both having a resonant frequency of f0. The second resonator element 186(1) has a first sub-resonator element 186A(1) and a second sub-resonator element 186B(1). The first sub-resonator element 186A(1) may also have the first polarity, while the second sub-resonator element 186B(1) may have the opposite polarity (e.g., f-type). The first sub-resonator element 186A(1) is mechanically coupled to the second sub-resonator element 186B(1). The second sub-resonator element 186B(1) is coupled to two parallel output capacitors 188A(1), 188B(1). The first parallel output capacitor 188A(1) is coupled to the output 124(3) and the second parallel output capacitor 188B(1) is coupled to the output 124(2).

Figure 15:
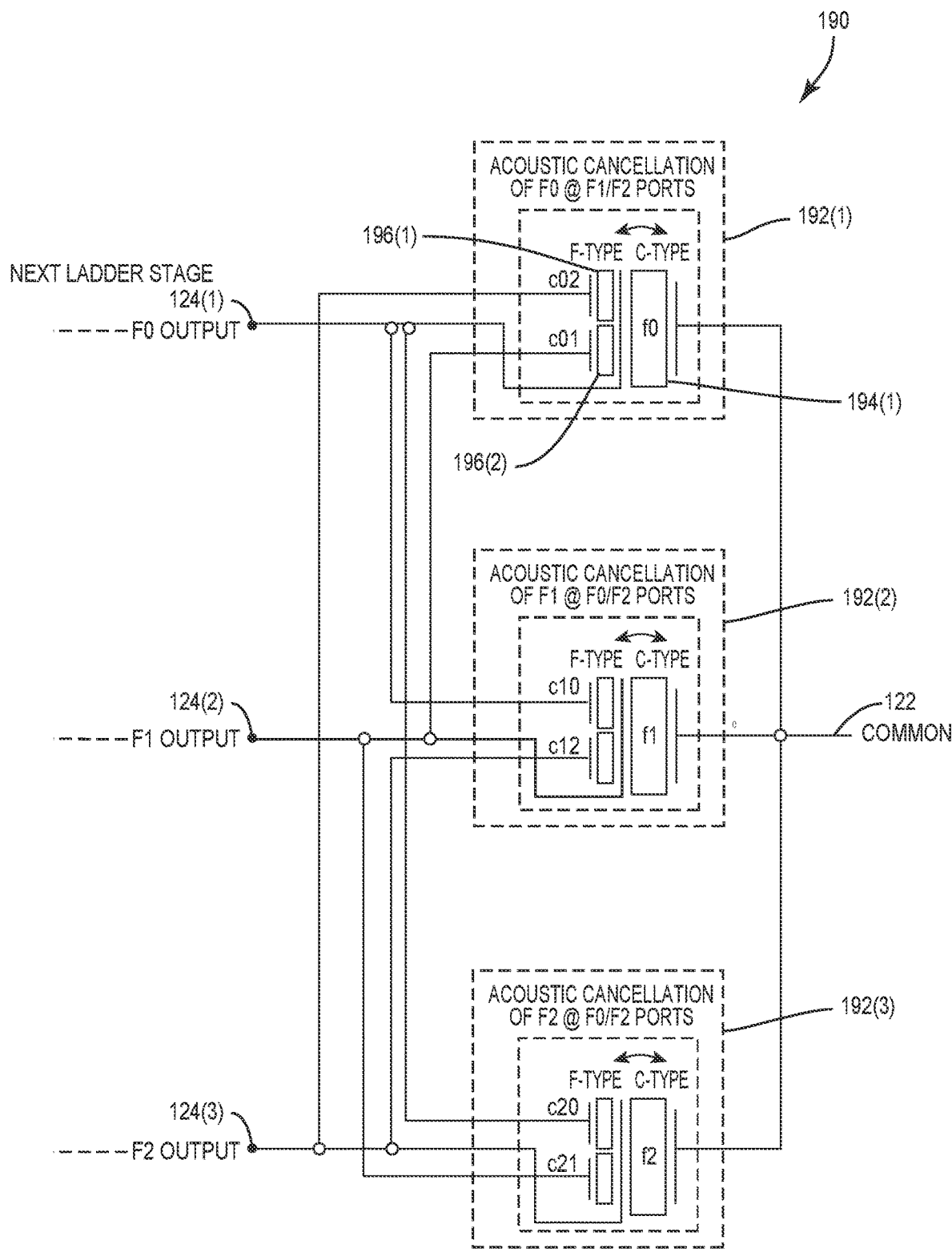
FIG. 15 illustrates an alternate N-multiplexer having a first resonator merged with the second resonator.

FIG. 15 illustrates still another topology for the acoustic filters within a multiplexer 190. The multiplexer 190 includes acoustic filters 192(1)-192(3). The first acoustic filter 192(1) includes a first resonator element 194(1) that is mechanically coupled to a plurality of sub-resonator elements 196(1)-196(2). The third terminal of the acoustic filter 192(1) forms the output 124(1) while the outputs from the sub-resonator elements 196(1), 196(2) are coupled to the outputs 124(3) and 124(2), respectively.

It should be appreciated that the aspects illustrated in FIGS. 10-15 provide designers different options to achieve desired cancelations. Different ones of such options may be more applicable to a design based on design criteria, cost requirements, or the like.

As alluded to earlier, multiplexers such as those described herein may be found in myriad computing devices such as a mobile terminal. An exemplary mobile terminal 200 that may include one of the multiplexers described herein is provided with reference to FIG. 16. In this regard, FIG. 16 is a system-level block diagram of an exemplary mobile terminal 200 such as a smart phone, mobile computing device tablet, or the like.

Figure 16:
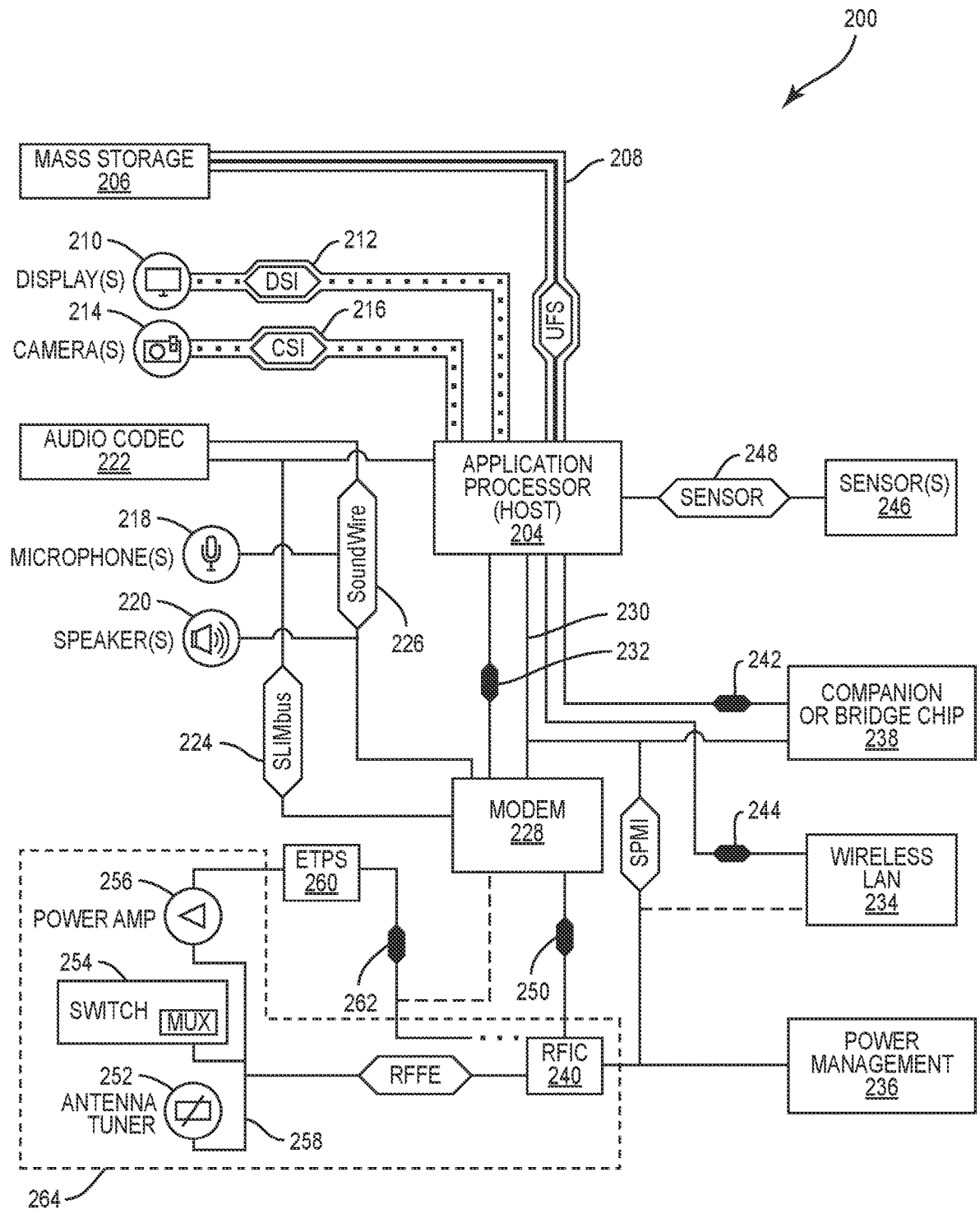
FIG. 16 illustrates a mobile communication device that may include the N-multiplexer of the present disclosure.

With continued reference to FIG. 16, the mobile terminal 200 includes an application processor 204 (sometimes referred to as a host) that communicates with a mass storage element 206 through a universal flash storage (UFS) bus 208. The application processor 204 may further be connected to a display 210 through a display serial interface (DSI) bus 212 and a camera 214 through a camera serial interface (CSI) bus 216. Various audio elements such as a microphone 218, a speaker 220, and an audio codec 222 may be coupled to the application processor 204 through a serial low-power interchip multimedia bus (SLIMbus) 224. Additionally, the audio elements may communicate with each other through a SOUNDWIRE bus 226. A modem 228 may also be coupled to the SLIMbus 224 and/or the SOUNDWIRE bus 226. The modem 228 may further be connected to the application processor 204 through a peripheral component interconnect (PCI) or PCI express (PCIe) bus 230 and/or a system power management interface (SPMI) bus 232.

With continued reference to FIG. 16, the SPMI bus 232 may also be coupled to a local area network (LAN or WLAN) IC (LAN IC or WLAN IC) 234, a power management integrated circuit (PMIC) 236, a companion IC (sometimes referred to as a bridge chip) 238, and a radio frequency IC (RFIC) 240. It should be appreciated that separate PCI buses 242 and 244 may also couple the application processor 204 to the companion IC 238 and the WLAN IC 234. The application processor 204 may further be connected to sensors 246 through a sensor bus 248. The modem 228 and the RFIC 240 may communicate using a bus 250.

With continued reference to FIG. 16, the RFIC 240 may couple to one or more RFFE elements, such as an antenna tuner 252, a switch 254, and a power amplifier 256 through a radio frequency front end (RFFE) bus 258. Additionally, the RFIC 240 may couple to an envelope tracking power supply (ETPS) 260 through a bus 262, and the ETPS 260 may communicate with the power amplifier 256. Collectively, the RFFE elements, including the RFIC 240, may be considered an RFFE system 264. It should be appreciated that the RFFE bus 258 may be formed from a clock line and a data line (not illustrated). While multiplexers may be provided in any number of elements within a mobile terminal, it should be appreciated that elements such as the switch 254 may rely heavily on multiplexers and need good isolation between ports and are accordingly good candidates for use of the multiplexers described herein.

Those skilled in the art will recognize improvements and modifications to the preferred embodiments of the present disclosure. All such improvements and modifications are considered within the scope of the concepts disclosed herein and the claims that follow.

What is claimed is:

1. A multiplexer comprising:
an input;
a first acoustic filter comprising:
a first resonator element comprising:
a first terminal electrically coupled to the input; and
a second terminal, wherein the first resonator element is configured to pass a first frequency to the second terminal; and
a second resonator element comprising:
a first sub-resonator element having a first polarity, the first sub-resonator element having a seventh terminal electrically coupled to the first terminal; and
a second sub-resonator element having a second polarity opposite the first polarity, the second sub-resonator element mechanically coupled to the first sub-resonator element with a third terminal therebetween; and
a second acoustic filter comprising:
a third resonator element comprising:
a fourth terminal electrically coupled to the input; and
a fifth terminal, wherein the second resonator element is configured to cancel signal leakage at the first frequency at the fifth terminal; and
a fourth resonator element comprising
a third sub-resonator element having the first polarity, the third sub-resonator element having an eighth terminal electrically coupled to the fourth terminal; and
a fourth sub-resonator element having the second polarity, the fourth sub-resonator element mechanically coupled to the third sub-resonator with a sixth terminal therebetween;
wherein the fourth sub-resonator element is electrically coupled to the second terminal through a ninth terminal and the second sub-resonator element is electrically coupled to the fifth terminal through a tenth terminal.

2. The multiplexer of claim 1, wherein the first resonator element and the third resonator element also have the first polarity.

3. The multiplexer of claim 1, further comprising a capacitor coupled to the third terminal.

4. The multiplexer of claim 1, wherein the first acoustic filter further comprises a fifth resonator element.

5. The multiplexer of claim 4, wherein the fifth resonator element comprises: a fifth sub-resonator element having the first polarity; and a sixth sub-resonator element having the second polarity, the sixth sub-resonator element mechanically coupled to the fifth sub-resonator.

6. The multiplexer of claim 5, further comprising a third acoustic filter coupled to the input and wherein the sixth sub-resonator element is coupled to the third acoustic filter.

7. The multiplexer of claim 5, further comprising a capacitor coupled to the first and second sub-resonator elements.

8. The multiplexer of claim 1, further comprising a fifth resonator element serially coupled to the second terminal.

9. The multiplexer of claim 1, further comprising a first output capacitor and a second output capacitor coupled to the second sub-resonator element.

10. The multiplexer of claim 1, wherein the second acoustic filter further comprises a fifth sub-resonator element mechanically coupled to the third sub-resonator element.

11. A multiplexer comprising:
an input;
a first acoustic filter comprising:
a first resonator element comprising:
a first terminal electrically coupled to the input; and
a second terminal; and
a second resonator element comprising:
a first sub-resonator element having a first polarity, the first sub-resonator element having a seventh terminal electrically coupled to the first terminal; and
a second sub-resonator element having a second polarity opposite the first polarity, the second sub-resonator element mechanically coupled to the first sub-resonator element with a third terminal therebetween and a capacitor coupled to the third terminal; and a second acoustic filter comprising:
  a third resonator element comprising:
    a fourth terminal electrically coupled to the input; and
    a fifth terminal; and
  a fourth resonator element comprising
    a third sub-resonator element having the first polarity, the third sub-resonator element having an eighth terminal electrically coupled to the fourth terminal; and
    a fourth sub-resonator element having the second polarity, the fourth sub-resonator element mechanically coupled to the third sub-resonator with a sixth terminal therebetween;
wherein the fourth sub-resonator element is electrically coupled to the second terminal through a ninth terminal and the second sub-resonator element is electrically coupled to the fifth terminal through a tenth terminal.

12. A multiplexer comprising:
an input;
a first acoustic filter comprising:
  a first resonator element comprising:
    a first terminal electrically coupled to the input; and
    a second terminal; and
  a second resonator element comprising:
    a first sub-resonator element having a first polarity, the first sub-resonator element having a seventh terminal electrically coupled to the first terminal; and
    a second sub-resonator element having a second polarity opposite the first polarity, the second sub-resonator element mechanically coupled to the first sub-resonator element with a third terminal therebetween; and
a second acoustic filter comprising:
  a third resonator element comprising:
    a fourth terminal electrically coupled to the input; and
    a fifth terminal; and
  a fourth resonator element comprising
    a third sub-resonator element having the first polarity, the third sub-resonator element having an eighth terminal electrically coupled to the fourth terminal; and
    a fourth sub-resonator element having the second polarity, the fourth sub-resonator element mechanically coupled to the third sub-resonator with a sixth terminal therebetween;
wherein the fourth sub-resonator element is electrically coupled to the second terminal through a ninth terminal and the second sub-resonator element is electrically coupled to the fifth terminal through a tenth terminal; and
a first output capacitor and a second output capacitor coupled to the second sub-resonator element.

* * * * *